(12) United States Patent
Lin et al.

(10) Patent No.: US 7,381,642 B2
(45) Date of Patent: Jun. 3, 2008

(54) TOP LAYERS OF METAL FOR INTEGRATED CIRCUITS

(75) Inventors: Mou-Shiung Lin, Hsin-Chu (TW);
Chiu-Ming Chou, Kao-Hsiung (TW);
Chien-Kang Chou, Shin-Hwa Town (TW)

(73) Assignee: Megica Corporation, Hsin-chu (TW)

( * ) Notice: Subject to any disclaimer, the term of this patent is extended or adjusted under 35 U.S.C. 154(b) by 116 days.

(21) Appl. No.: 11/017,168

(22) Filed: Dec. 20, 2004

(65) Prior Publication Data

US 2006/0063378 A1    Mar. 23, 2006

Related U.S. Application Data

(63) Continuation-in-part of application No. 10/948,020, filed on Sep. 23, 2004.

(51) Int. Cl.
*H01L 21/4763* (2006.01)
(52) U.S. Cl. ............... 438/642; 438/668; 257/E21.627
(58) Field of Classification Search ............... 438/642, 438/666, 668; 257/E21.627
See application file for complete search history.

(56) References Cited

U.S. PATENT DOCUMENTS

| | | | |
|---|---|---|---|
| 4,423,547 A | 1/1984 | Farrar et al. | |
| 4,618,878 A | 10/1986 | Aoyama et al. | |
| 5,055,907 A | 10/1991 | Jacobs | 357/71 |
| 5,083,187 A | 1/1992 | Lamson et al. | |
| 5,106,461 A | 4/1992 | Volfson et al. | 205/125 |
| 5,108,950 A | 4/1992 | Wakabayashi et al. | |
| 5,212,403 A | 5/1993 | Nakanishi et al. | 257/664 |
| 5,227,012 A | 7/1993 | Brandli et al. | |
| 5,384,488 A | 1/1995 | Golshan et al. | |
| 5,416,356 A | 5/1995 | Staudinger et al. | |
| 5,468,984 A | 11/1995 | Efland et al. | |
| 5,478,773 A | 12/1995 | Dow et al. | |
| 5,501,006 A | 3/1996 | Gehman, Jr. et al. | 29/840 |
| 5,635,767 A | 6/1997 | Wenzel et al. | 257/778 |
| 5,659,201 A | 8/1997 | Wollesen | |
| 5,665,639 A | 9/1997 | Seppala et al. | |
| 5,686,764 A | 11/1997 | Fulcher | 527/778 |
| 5,789,303 A | 8/1998 | Leung et al. | |
| 5,834,844 A | 11/1998 | Akagawa et al. | |
| 5,854,513 A | 12/1998 | Kim | |
| 5,929,508 A | 7/1999 | Delgado et al. | |
| 5,945,709 A * | 8/1999 | Williams et al. | 257/343 |
| 5,969,424 A | 10/1999 | Matsuki et al. | |
| 6,020,640 A | 2/2000 | Efland et al. | |

(Continued)

OTHER PUBLICATIONS

Stanley Wolf, *Silicon Processing for the VLSI Era*, vol. 2, pp. 214-217, Lattice Press, Sunset Beach, CA, c. 1990.

(Continued)

*Primary Examiner*—Caridad Everhart
(74) *Attorney, Agent, or Firm*—Saile Ackerman LLC; Stephen B. Ackerman; Rosemary L.S. Pike

(57) ABSTRACT

The present invention adds one or more thick layers of polymer dielectric and one or more layers of thick, wide metal lines on top of a finished semiconductor wafer, post-passivation. The thick, wide metal lines may be used for long signal paths and can also be used for power buses or power planes, clock distribution networks, critical signal, and re-distribution of I/O pads.

48 Claims, 14 Drawing Sheets

U.S. PATENT DOCUMENTS

| | | | |
|---|---|---|---|
| 6,030,877 | A | 2/2000 | Lee et al. |
| 6,066,877 | A | 5/2000 | Williams et al. |
| 6,103,552 | A | 8/2000 | Lin |
| 6,144,100 | A | 11/2000 | Shen et al. |
| 6,146,958 | A | 11/2000 | Zhao et al. |
| 6,159,773 | A | 12/2000 | Lin |
| 6,184,143 | B1 | 2/2001 | Ohashi et al. |
| 6,187,680 | B1 | 2/2001 | Costrini et al. |
| 6,229,221 | B1 | 5/2001 | Kloen et al. |
| 6,236,101 | B1 | 5/2001 | Erdeljac et al. |
| 6,272,736 | B1 | 8/2001 | Lee |
| 6,303,423 | B1 | 10/2001 | Lin |
| 6,383,916 | B1 | 5/2002 | Lin |
| 6,455,885 | B1 | 9/2002 | Lin |
| 6,459,135 | B1 | 10/2002 | Basteres et al. |
| 6,465,879 | B1 | 10/2002 | Taguchi |
| 6,472,745 | B1 | 10/2002 | Iizuka |
| 6,495,442 | B1 | 12/2002 | Lin et al. |
| 6,501,169 | B1 | 12/2002 | Aoki et al. |
| 6,544,880 | B1 | 4/2003 | Akram |
| 6,545,354 | B1 | 4/2003 | Aoki et al. |
| 6,560,862 | B1 | 5/2003 | Chen et al. |
| 6,605,528 | B1 | 8/2003 | Lin et al. |
| 6,636,139 | B2 | 10/2003 | Tsai et al. |
| 6,649,509 | B1 | 11/2003 | Lin et al. |
| 6,683,380 | B2 | 1/2004 | Efland et al. |
| 6,707,159 | B1 | 3/2004 | Kumamoto et al. |
| 6,734,563 | B2 | 5/2004 | Lin et al. |
| 6,800,555 | B2 | 10/2004 | Test et al. |
| 2001/0035452 | A1 | 11/2001 | Test et al. |
| 2002/0017730 | A1 | 2/2002 | Tahara et al. |
| 2002/0109232 | A1 | 8/2002 | Lin et al. |
| 2002/0115282 | A1 | 8/2002 | Lin et al. |
| 2002/0123872 | A1* | 9/2002 | Okada .................. 703/15 |
| 2002/0158334 | A1 | 10/2002 | Vu et al. |
| 2003/0102551 | A1 | 6/2003 | Kikuchi |
| 2003/0214041 | A1* | 11/2003 | Suzuki et al. ............. 257/758 |
| 2004/0089951 | A1 | 5/2004 | Lin |
| 2004/0166659 | A1 | 8/2004 | Lin et al. |
| 2005/0020021 | A1* | 1/2005 | Fujiwara et al. ........... 438/303 |
| 2005/0104177 | A1 | 5/2005 | Lin et al. |
| 2006/0049483 | A1 | 3/2006 | Lin et al. |
| 2006/0049524 | A1 | 3/2006 | Lin et al. |
| 2006/0049525 | A1 | 3/2006 | Lin et al. |
| 2006/0063378 | A1 | 3/2006 | Lin et al. |
| 2006/0076687 | A1 | 4/2006 | Lin et al. |

OTHER PUBLICATIONS

Co-pending U.S. Patent MSL-98-002CCC_CIP, U.S. Appl. No. 10/154,662, filed May 24, 2002, Top Layers of Metal for High Performance IC's, assigned to the same assignee as the present invention.

* cited by examiner

TOP LAYERS OF METAL FOR INTEGRATED CIRCUITS

RELATED PATENT APPLICATIONS

This is a continuation-in-part application of, Ser. No. 10/948,020, filed on Sep. 23, 2004, which is related to Ser. No. 10/154,662 filed on May 24, 2002, a continuation-in-part application of Ser. No. 10/058,259, filed on Jan. 29, 2002, now issued as U.S. Pat. No. 6,660,728, which is a continuation application of Ser. No. 09/251,183, filed on Feb. 17, 1999, now issued as U.S. Pat. No. 6,383,916, which is a continuation-in-part application of Ser. No. 09/216,791, filed on Dec. 21, 1998, abandoned, all of which are herein incorporated by reference in their entirety.

BACKGROUND OF THE INVENTION (1) Field of the Invention

The invention relates to the manufacturing of high performance, high current, low power, and/or low voltage Integrated Circuit (IC's), and more specifically to methods of achieving high performance of the Integrated Circuits by reducing the capacitance and resistance of inter-connecting wiring on chip.

(2) Description of the Related Art

When the geometric dimensions of Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on the circuit performance. The capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires. To solve this problem, the approach has been taken to develop low resistance metal (such as copper) for the wires while low-k dielectric materials are used in between signal lines. From the aspect of IC metal interconnection history, sputtered aluminum has been a mainstream IC interconnection metal material since the 1960's. The aluminum film is sputtered to cover the whole wafer, and then the metal is patterned using photolithography methods and dry and/or wet etching. It is technically difficult and economically expensive to create thicker than 2 µm aluminum metal lines due to the cost and stress concerns of blanket sputtering. About 1995, damascene copper metal became an alternative for IC metal interconnection. In damascene copper, the insulator is patterned and copper metal lines are formed within the insulator openings by blanket electroplating copper and chemical mechanical polishing (CMP) to remove the unwanted copper. Electroplating the whole wafer with thick metal creates large stress. Furthermore, the thickness of damascene copper is usually defined by the insulator thickness, typically chemical vapor deposited (CVD) oxides, which does not offer the desired thickness due to stress and cost concerns. Again it is also technically difficult and economically expensive to create thicker than 2 µm copper lines.

U.S. Pat. No. 5,212,403 (Nakanishi) shows a method of forming wiring connections both inside and outside (in a wiring substrate over the chip) for a logic circuit depending on the length of the wire connections.

U.S. Pat. No. 5,501,006 (Gehman, Jr. et al.) shows a structure with an insulating layer between the integrated circuit (IC) and the wiring substrate. A distribution lead connects the bonding pads of the IC to the bonding pads of the substrate.

U.S. Pat. No. 5,055,907 (Jacobs) discloses an extended integration semiconductor structure that allows manufacturers to integrate circuitry beyond the chip boundaries by forming a thin film multi-layer wiring decal on the support substrate and over the chip.

U.S. Pat. No. 5,106,461 (Volfson et al.) teaches a multi layer interconnect structure of alternating polyimide (dielectric) and metal layers over an IC in a TAB structure.

U.S. Pat. No. 5,635,767 (Wenzel et al.) teaches a method for reducing RC delay by a PBGA that separates multiple metal layers.

U.S. Pat. No. 5,686,764 (Fulcher) shows a flip chip substrate that reduces RC delay by separating the power and I/O traces.

Stanley Wolf in *Silicon Processing for the VLSI Era*, Vol. 2, pp. 214–217, Lattice Press, Sunset Beach, Calif. c. 1990, discusses the use of polyimide as an intermetal dielectric in the 1980's. However, many drawbacks of using polyimide are listed and polyimide has not been used for this purpose much in the time period since then.

SUMMARY OF THE INVENTION

It is the primary objective of the present invention to improve the performance of High Performance Integrated Circuits.

Another objective of the present invention is to reduce resistive voltage drop of the power supply buses that connect the IC to surrounding circuitry or circuit components.

Another objective of the present invention is to reduce resistance of the power supply buses for high current ICs.

Yet another objective of the present invention is to reduce resistance of IC metal interconnection for low voltage ICs.

Another objective of the present invention is to reduce resistance and load of IC metal interconnection for low power ICs.

A further objective of the present invention is to reduce the RC delay constant of the signal paths of high performance IC's.

A still further objective of the present invention is to facilitate the application of IC's of reduced size and increased circuit density.

Yet another objective of the present invention is to further facilitate and enhance the application of low resistance conductor metals.

Yet another objective of the present invention is to further facilitate and enhance the application of low capacitance conductor metals.

Yet another objective of the present invention is to allow for increased I/O pin count for the use of high performance IC's.

Yet another objective of the present invention is to simplify chip assembly by reducing the need for re-distribution of I/O chip connections.

Yet another objective of the present invention is to facilitate the connection of high-performance IC's to power/ground buses.

Yet another objective of the present invention is to facilitate the connection of high-performance IC's to clock distribution networks.

Yet another objective of the present invention is to reduce IC manufacturing costs by allowing or facilitating the use of less expensive process equipment and by accommodating less strict application of clean room requirements, as compared to sub-micron manufacturing requirements.

Yet another objective of the present invention is to be a driving force and stimulus for future system-on-chip designs since the present invention allows ready and cost effective interconnection between functional circuits that are positioned at relatively large distances from each other on the chip.

Yet another objective of the present design is to form the basis for a computer based routing tool that automatically routes interconnections that exceed a pre-determined length in accordance with the type of interconnection that needs to be established.

The present invention adds one or more thick layers of polymer dielectric and one or more layers of thick, wide metal lines on top of the finished device wafer passivation. The thick layer of dielectric can, for example, be of polyimide or benzocyclobutene (BCB) with a thickness of over, for example, 3 um. The thick, wide metal lines can, for instance, be of electroplated copper or gold. These layers of dielectric and metal lines are of primary benefit for long signal paths and can also be used for power/ground buses or power/ground planes, clock distribution networks, critical signal, or re-distribution of I/O pads for flip chip applications. The resistance times capacitance (RC product) of the thick, wide metal lines is substantially smaller than the RC product of the fine line metallization structure under the passivation.

Furthermore, a method for forming a post-passivation, top metallization system for high performance integrated circuits is provided. An integrated circuit is provided, having devices formed in and on a semiconductor substrate. An overlaying fine line interconnecting metallization structure with first metal lines is connected to the devices, and has a passivation layer formed thereover, with first openings in the passivation layer to contact pads connected to the first metal lines. A top metallization system is formed above the passivation layer, connected to the interconnecting metallization structure, wherein the top metallization system has top metal lines, in one or more layers, having a thickness and width substantially greater than the first metal lines, and wherein the top metallization system connects portions of the interconnecting metallization structure to other portions of the interconnecting metallization structure. Significantly, the RC product of the top metallization system is substantially smaller than the RC product of the interconnecting metallization structure under the passivation.

BRIEF DESCRIPTION OF THE DRAWINGS

FIG. 5b shows a schematic view of fan-out connections between top pads of post-passivation metal scheme and lower pads of fine-line metal scheme using the post-passivation interconnection to replace the fan-out function of the BGA substrate interconnection as in the example of FIG. 5a.

FIG. 6b shows a schematic view of pad relocation connections between top pads of post-passivation metal scheme and lower pads of fine line metal scheme using the post-passivation interconnection to replace the pad relocation function of the BGA substrate interconnection as in the example of FIG. 6a.

FIG. 7b shows a schematic view of common power, ground and signal pad connections between top pads of post-passivation metal scheme and lower pads of fine line metal scheme) using the post-passivation interconnection to replace the common pad function of the BGA substrate interconnection as in the example of FIG. 7a.

DETAILED DESCRIPTION OF THE INVENTION

The present invention teaches an Integrated Circuit structure where key re-distribution and interconnection metal layers and dielectric layers are added over a conventional IC. These re-distribution and interconnection layers allow for wider buses and reduce conventional RC delay.

Figure 1A:
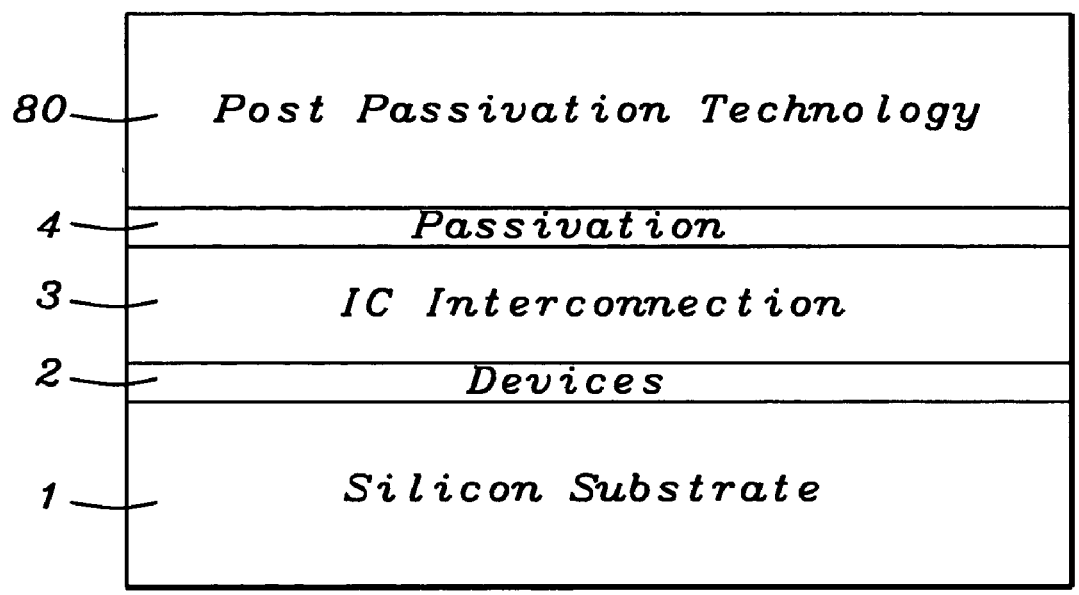
FIGS. 1a–1b show a cross section of the interconnection scheme of the present invention.

FIG. 1a shows a cross-sectional representation of a general view of the invention. Devices 2 are formed in and on a semiconductor substrate 1. These may be n-channel MOS devices, p-channel MOS devices, and/or CMOS devices. Metallization is accomplished in one or more layers of IC Interconnection 3, above the device layer. These metal layers are referred to as fine line metal interconnections. Typically, the intermetal dielectric (IMD) layers comprise silicon-based oxides, such as chemical vapor deposited (CVD) silicon oxide, CVD TEOS oxide, spin-on-glass (SOG), fluorosilicate glass (FSG), high density plasma CVD oxides, or the composite layer formed by a portion of this group of materials. The IMD layers typically have a thickness of between about 1000 and 10,000 Angstroms. The fine line metal interconnections are typically formed by sputtering aluminum or an aluminum alloy and patterning the aluminum to form the fine metal lines. Alternatively, the fine lines may be formed by a copper damascene process. In the copper damascene process, the copper is protected by an adhesion/barrier layer not only underlying the copper, but also surrounding the copper at the sidewalls of the line in order to prevent the migration of copper ions through the IMD which could adversely affect the underlying active devices. These fine lines typically have a thickness of between about 1000 and 10,000 Angstroms. In the fabrication process of the fine line metal interconnections, a clean room environment of class <=10 is typical. That is, no more than 10 particles larger than 0.5 microns are found in any given cubic foot of air. The fine line IC metal is fabricated using 5× steppers or scanners or better and using a photoresist layer having thickness of less than about 5 microns. The IC interconnection connects the devices to one another to form operational circuits, and also in its top layer are metal points of electrical contact (such as bond pads), which provide connections from the IC interconnection layer to outside of the IC.

A passivation layer 4 covers the IC interconnection scheme, while providing openings to the electrical contact points. The most frequently used passivation layer in the present state of the art is plasma enhanced CVD (PECVD) oxide and nitride. In creating layer 4, a layer of approximately 0.5 µm PECVD oxide is deposited first followed by a layer of greater than approximately 0.3 µm and preferably, about 0.7 µm nitride. Passivation layer 4 is very important because it protects the device wafer from moisture and foreign ion contamination. At least a nitride layer of greater than about 0.3 µm thick must be used in order to adequately prevent mobile ion and/or moisture penetration. The positioning of this layer between the sub-micron process (of the integrated circuit) and the tens-micron process (of post-passivation technology 80) is of critical importance since it allows for a cheaper process that has less stringent clean room requirements for the process of creating the interconnecting metallization structure above passivation layer 4.

In addition to PECVD oxide and PECVD nitride, passivation layer 4 may also be formed of silicon oxynitride, phosphosilicate glass (PSG), borosilicate glass (BSG), borophosphosilicate glass (BPSG), or combinations thereof.

In a key aspect of the invention, the passivation openings can be as small as 0.1 µm. In another critical aspect of the invention, a selective deposition process is used to form the Post Passivation Technology segment 80, in which metal lines are formed having a substantially smaller RC product than that of the metal lines in the IC Interconnection layer 3. More detail is provided below.

Figure 1B:
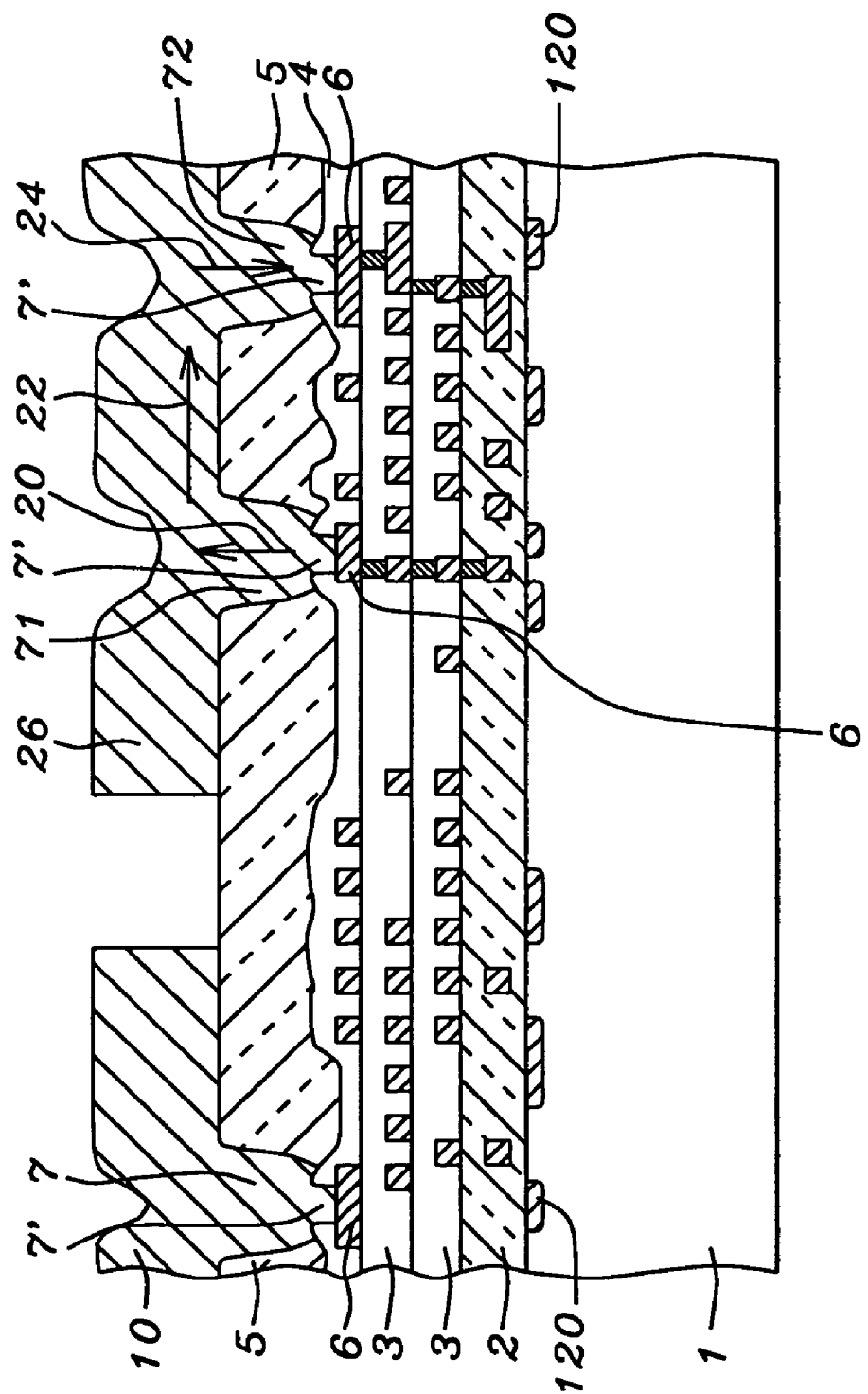

Referring now more specifically to FIG. 1b, there is shown a cross section of one implementation of the present invention. A silicon substrate 1 has transistors and other devices 2, formed in and on the semiconductor substrate 1, typically formed of polysilicon and other materials, covered by a dielectric layer deposited over the devices and the substrate. Source and drain diffusions 120 are shown within the substrate 1. Layer 3 indicates the totality of metal layers and dielectric layers that are typically created on top of the device layer 2. Points of contact 6, such as bonding pads known in the semiconductor art, are in the top surface of layers 3 and are part of layer 3. These points of contact 6 are points within the IC arrangement that need to be further connected to surrounding circuitry, that is to power lines or to signal lines. A passivation layer 4, formed of for example silicon nitride, is deposited on top of layer 3, as is known in the art for protecting underlying layers from moisture, contamination, etc.

The key steps of the invention begin with the optional deposition of a thick insulating layer 5 of a polymer. Layer 5 is a thick polymer insulating layer (for example polyimide) that has a thickness in excess of 2 µm (after curing). The range of polymer thickness can vary from 2 µm to 100 µm, dependent on electrical design requirements. The polymer insulating layer 5 is thicker than the intermetal dielectric layers in the interconnecting, fine-line, metallization structure 3 by 2 to 500 times.

For the deposition of layer 5 the polymer can be spin-on coated and cured. After spin-on coating, the polymer will be cured at 380 degrees C. for 4 hours in a vacuum or nitrogen ambient. For thicker polymer, the polymer film can be multiple coated and cured. Alternatively, the polymer layer can be deposited by screen printing or by laminating a dry layer of polymer.

A polymer such as a polyimide (HD Microsystems, Parlin, N.J.) can be used as the polymer. Another material that can be used to create layer 5 is the polymer benzocyclobutene (BCB) (Dow Chemical Company, Midland, Mich.), which has recently gained acceptance to be used instead of typical polyimide application. Yet other possible materials for layer 5 include a silicone elastomer or parylene. The epoxy-based material such as photoepoxy SU-8 (Sotec Microsystems, Renens, Switzerland) can also be used.

Openings 7, 71, and 72 and 7' through the polymer insulating layer 5 and the passivation layer 4 expose the contact points 6. First metal layer 10 and 26 is then selectively deposited to contact points 6 through the openings 7, 71, 72 and 7' in the polymer and passivation layers 5 and 4, as hereinafter described.

Figure 3A:
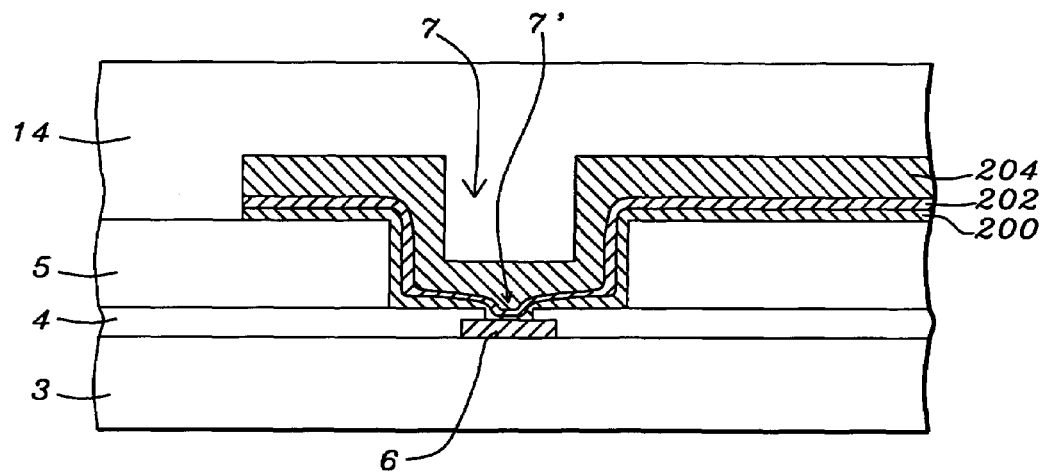
FIGS. 3a–3j shows a method of forming the post-passivation scheme for transitioning from a fine-line interconnection to the post passivation interconnection of the invention.

In one important aspect of the current invention, referring now to FIGS. 3a–3j, and specifically FIG. 3a, openings 7 in the polymer insulating layer 5 may be larger than openings 7' in the passivation layer 4. Openings 7' may be formed to as small as 0.1 µm, and may range in size from about 0.1 to 50 µm. Openings 7 in the polymer insulating layer 5 may be greater than or equal to about 2 µm. These small passivation vias 7' are advantageous for the following reasons:

(1) Small passivation vias 7' only need small underlying metal pads 6(or dog bone structures); and these small metal pads 6 will not block the routing capability of the top layer metal in the IC fine line interconnection scheme 3.

(2) Since the thickness of the inter-metal-dielectric (IMD) in the IC fine line interconnection 6 is thin, a small metal pad 6 provides reduced capacitance.

Figure 3B:
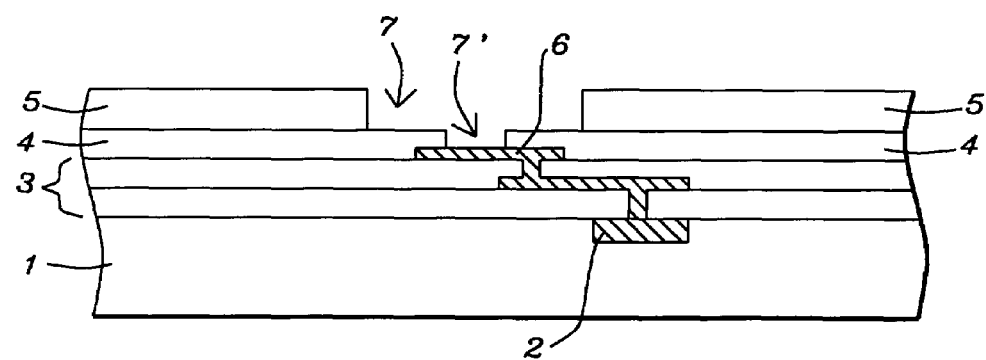
Figure 3C:
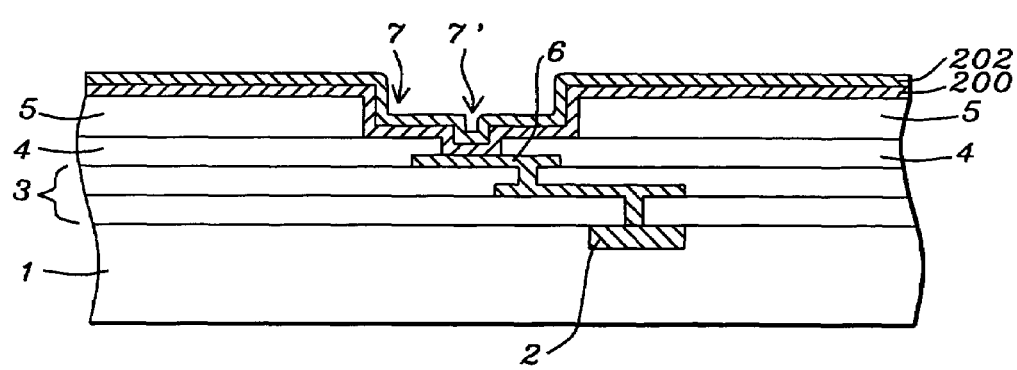

Electrical contact with the contact points 6 can now be established by filling the openings 7 (and 71) with a conductor. Simultaneously with filling of the openings 7, a first interconnect metal layer may be formed, as shown in FIG. 3a. The process steps are described in FIGS. 3b–3j. In FIGS. 3a and 3b, a photo-sensitive polymer insulating layer 5 is deposited over the passivation layer 4 and the passivation opening 7'. The deposited polymer is then exposed to create openings 7 aligning with the passivation opening 7'. In FIG. 3c, a thick metal layer is formed by first sputtering an adhesion/barrier layer 200 on the polymer layer 5 and in the openings 7 and 7'. The adhesion/barrier layer 200 is formed of titanium tungsten (TiW), chromium (Cr), titanium (Ti), tantalum nitride (TaN), or titanium nitride (TiN), and is deposited to a thickness of between about 0.01 and 3 microns. An electroplating seed layer 202 is then deposited on the adhesion/barrier layer 200 by sputtering, the seed layer material being copper (Cu), gold (Au), silver (Ag), palladium (Pd) or nickel (Ni), formed to a thickness of between about 0.05 and 3 microns. Cu is used as the seed layer 202 when copper is to be electroplated for creating the thick metal layer 204, Au used as the seed layer 202 for plating gold to create the thick metal layer 204, Ag used as the seed layer 202 for plating silver to create the thick metal layer 204, Pd used as seed layer 202 for plating palladium to create the thick metal layer 204, and Ni used as seed layer 202 for plating nickel to create the thick metal layer 204.

Figure 3D:
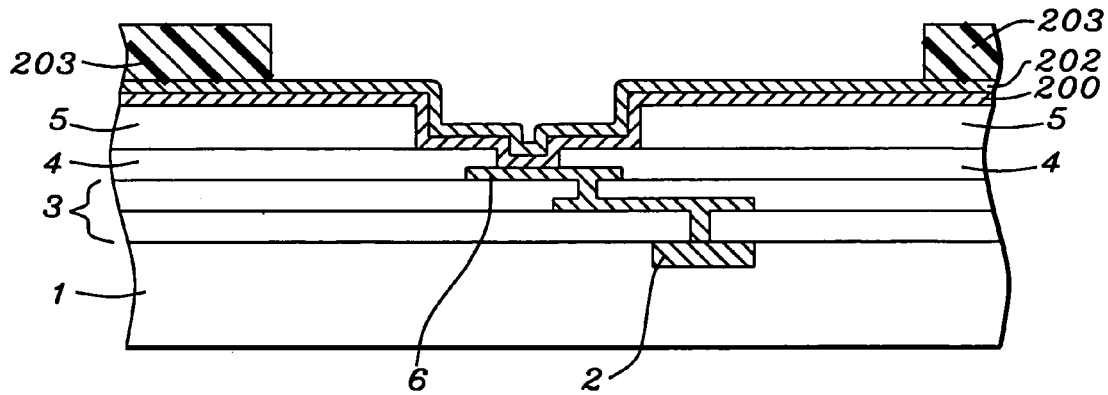
Figure 3E:
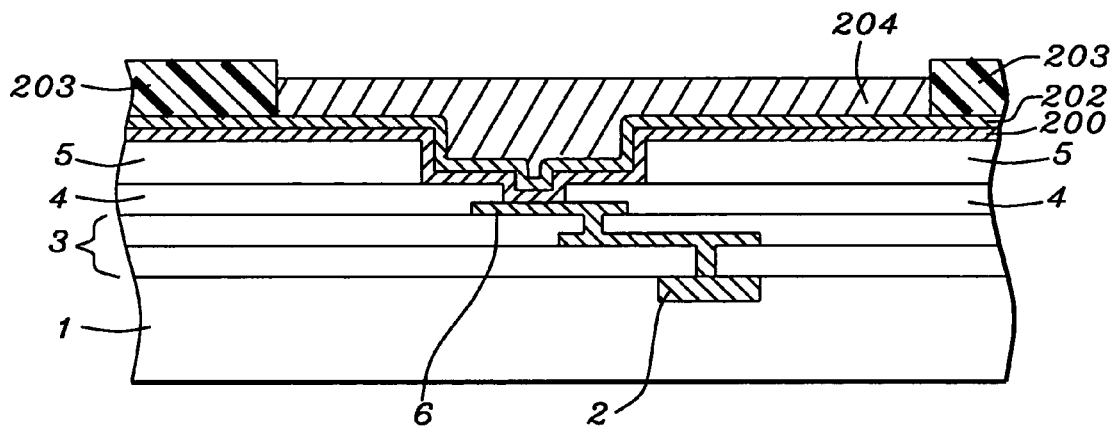

A thick photoresist 203, as depicted in FIG. 3d, of between about 2 and 100 microns thickness, is next deposited and patterned over the seed layer 202. In a selective deposition process, a thick layer of metal, such as copper (Cu), gold (Au), silver (Ag), palladium (Pd) or nickel (Ni), is then electroplated to a thickness of between about 2 and 100 microns, as shown in FIG. 3e, to form thick, wide metal interconnections 204 and to fill openings 7. Thus, a selective deposition process forms the post-passivation metal structure. An advantage of the selective deposition process of the invention is a minimization of wasted material, especially when precious metal, such as gold, silver, or palladium is used. In the selective deposition process, the metal is electroplated only where it is needed. In contrast, in the standard metal damascene process used for fine line metallization, metal is electroplated everywhere and then etched or polished away where it is not needed. Covering the whole wafer with thick metal creates stress which causes the process problem. This is a waste of metal, especially for the cases when precious metal is used. The removed metal is often contaminated and may not be able to be reused or may be very expensive to be reused.

Furthermore, in the selective deposition process of the invention, the thickness of selective electroplated metal is defined by the thickness of photoresist, which can be formed as thick as 100 microns. In other words, it is feasible and cost-effective to form thick metal by selective electroplating. By contrast, it is technically difficult to form thick metal by a damascene copper process. A primary limitation to forming thick copper damascene lines is the thickness of the chemical vapor deposited (CVD) oxides which define the damascene copper thickness. CVD oxides cannot be thickly deposited due to stress concerns. It is also very expensive to deposit thick CVD oxides.

Figure 3F:
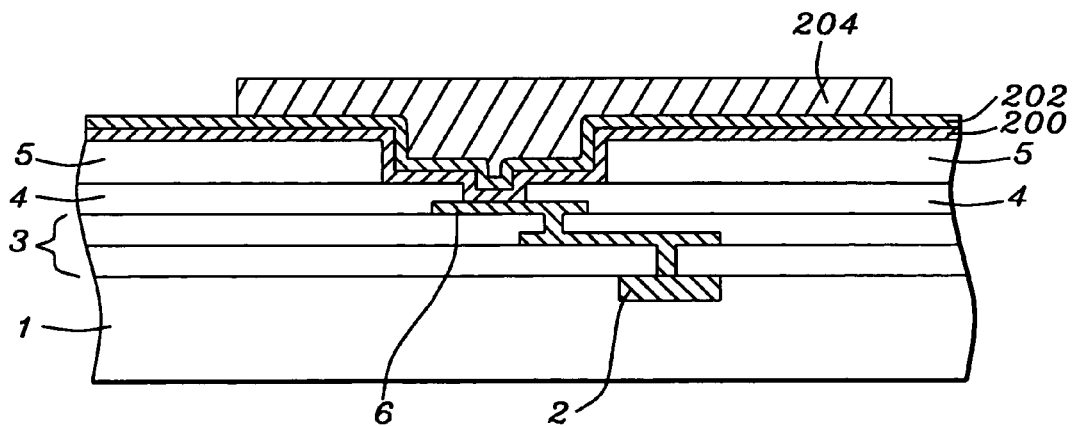
Figure 3G:
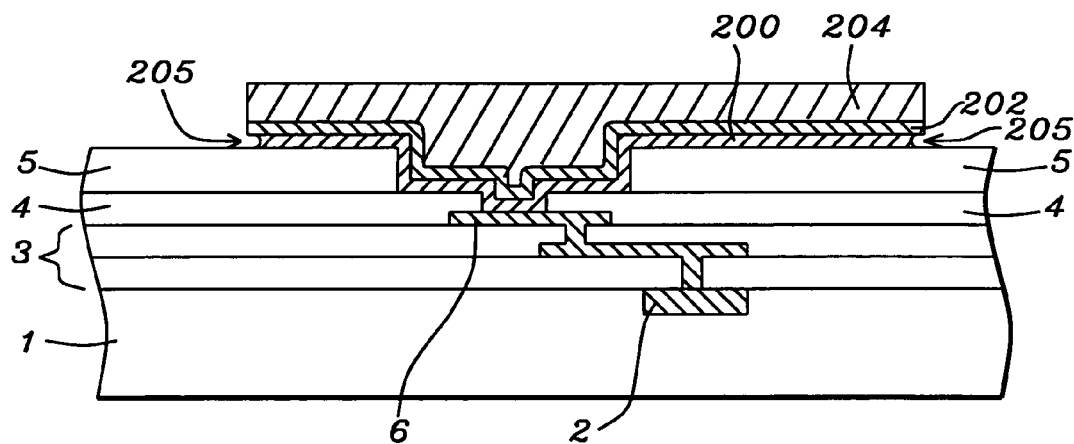
Figure 3H:
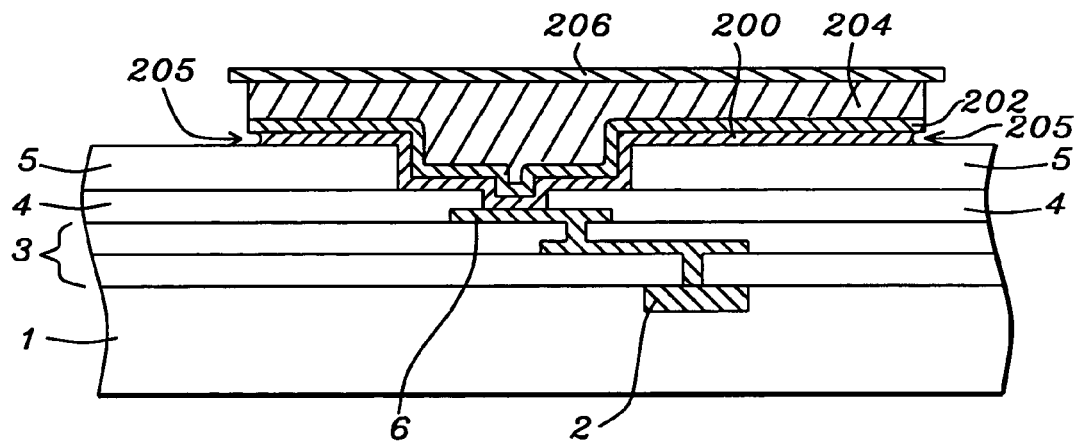

Referring now to FIGS. 3f and 3g, the photoresist 203 is then stripped, and portions of the seed metal 202 and adhesion metal 200 not under the thick metal layer 204 are removed, using the thick metal 204 as an etch mask. During the self-aligned wet etching of the adhesion/barrier layer 200, an undercut 205 is formed in the adhesion/barrier layer 200, as shown in FIG. 3g. The undercut is usually between about 0.03 to 2.0 microns deep per side, depending on etching recipe and over-etch time. The structure of the thick, wide, post-passivation metal interconnections is different from the structure of the fine line interconnections. In addition to the undercut 205 in the adhesion/barrier layer 200, there is a clear boundary between the sputtered thin gold layer 202 and the electroplated thick gold 204. This can be seen, for example, in a transmission electron microscope (TEM) image. The boundary is due to different grain sizes and/or grain orientation in the two gold layers 202 and 204. For example, in a 1,000 Angstroms thick sputtered gold layer 202 under a 4 microns thick electroplated gold layer 204, the grain size of the sputtered gold layer 202 is about 1,000 Angstroms, and the grain boundary is perpendicular to the surface of the substrate. The grain size of the electroplated gold 204 is greater than 2 microns with the grain boundary not perpendicular, and typically, at an angle of about 45 degrees from the substrate surface. In the fine line metal interconnections, there is no undercutting or clear boundary of grain size difference inside the aluminum layer.

Where Cu is used for electroplating to create the thick metal layer 204, an optional nickel cap layer 206 on the thick metal layer 204 may be used to prevent copper corrosion, as shown in FIG. 3h. Additionally, the adhesion/barrier layer 200 in the post-passivation metal structure remains only under the copper line, as shown in FIG. 3h. In the copper damascene process of the fine line metallization, the adhesion/barrier layer is adjacent to the copper not only at the bottom, but also at the sidewalls of the copper line.

In more detail, the clean room environment of the post-passivation metal process can be class 100 or more; that is, containing more than 100 particles larger than 0.5 microns in any given cubic foot of air. During photolithography in the post-passivation metal process, aligners or 1× steppers are used with a photoresist 203 having a thickness of greater than about 5 microns. This contrasts with the fine line IC metal, fabricated using 5× steppers or scanners or better in a class 10 environment or better and using a photoresist layer having a thickness of less than 5 microns. The thick, wide metal lines 204 have a thickness of between about 2 and 100 microns and a width of greater than about 2 microns. Furthermore, the spacing between two adjacent thick, wide metal lines 204 at the same layer is greater than about 2 microns.

Figure 3I:
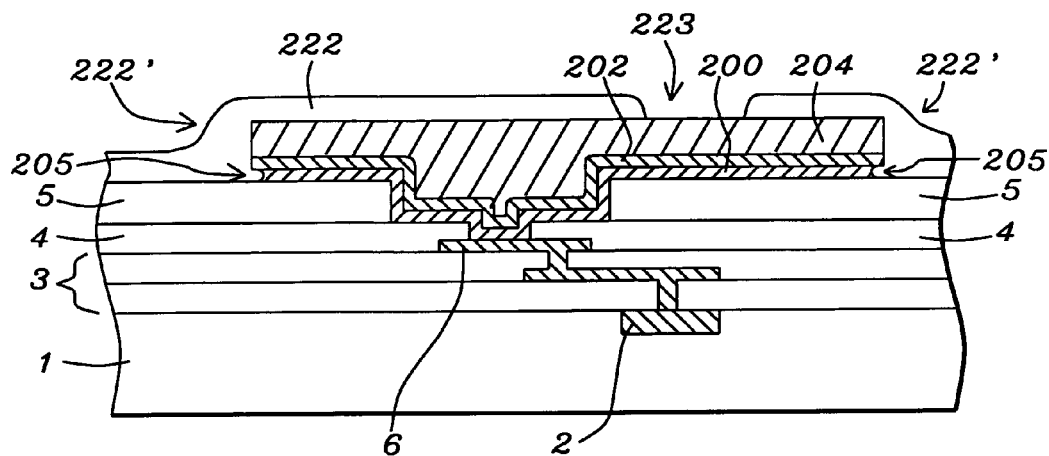
Figure 3J:
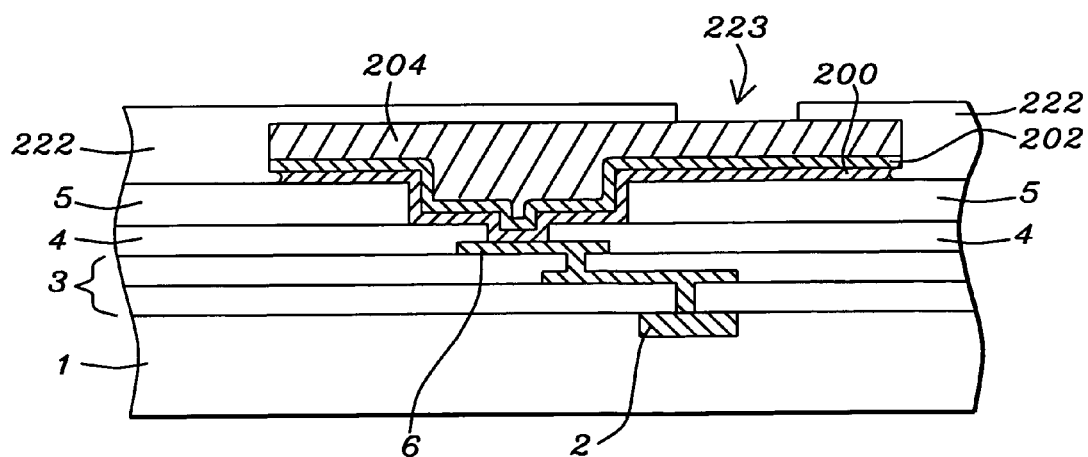

Subsequent metal layers may be formed in a similar manner to that shown for the first metal layer in FIGS. 3a–h. For example, referring to FIG. 3i, another thick intermetal polymer layer 222 is deposited over the interconnect line 204 as described above and an opening 223 in the polymer layer 222 is formed for connection of the next metal layer to the first metal layer. A step 222' exists in the intermetal polymer layer at the edge of the underlying thick metal 204. Polymer like polyimide is usually a good planarization material, especially in filling small metal gaps. However, the degree of planarization is not 100%. For post-passivation thick metal, the intermetal polymer layer 222 may require a planarization process. FIG. 3j shows a polymer layer 222 planarized by the chemical-mechanical polishing (CMP). The step 222' in FIG. 3i disappears in FIG. 3j. CMP can be performed before or after the intermetal polymer opening 223 is formed. Adhesion and electroplating seed layers are then sputtered, a thick photoresist deposited and the next thick, wide metal layer electroplated, in a similar manner to the first metal layer. It will be understood that the intermetal polymer layer 222 can be deposited in a like manner over the thick, wide metal line having the nickel cap 206, as shown in FIG. 3h. The intermetal polymer 222 can be planarized or not, as shown in FIGS. 3j and 3i, respectively.

The thick, wide metal 204 of the post passivation process of the invention is thicker than the typical fine-line metal layers 3 by a ratio of between about 2 and 1000 times. The thick, wide metal layers 204 are formed into interconnecting lines that also are wider than the fine-line metal by a ratio of between about 2 and 1000 times. The thick, wide metal lines 204 have a thickness of between about 2 and 100 µm, and a width of greater than or equal to 2 µm. Line spacing preferably is greater than or equal to 2 µm. Thicker, wider metal 204 in the post-passivation process of the invention reduces the resistance of these interconnections.

Resistance of metal interconnections in an integrated circuit is determined by the material to be used and metal thickness and width, while capacitance is related to dielectric types, thickness, and metal line width, spacing, and thickness. Metal capacitance includes three components: 1) plate capacitance which is a function of the metal width to dielectric thickness aspect ratio, 2) coupling capacitance which is a function of the metal thickness to line spacing aspect ratio, and 3) fringing capacitance which is a function of metal thickness, spacing, and dielectric thickness.

In a first example, to the extreme of the fine line metal capability, fine line metal thickness is about 2 µm, fine line metal width is about 10 µm, fine line IMD thickness is about 2 µm, and the line spacing is about 10 µm. Post-passivation metal thickness is about 5 µm, metal width is about 10 µm, dielectric thickness is about 5 µm, and lines spacing is also about 10 µm. The metal thickness difference results in a 2.5 times reduction in resistance in the post-passivation metal structure over the fine line metal structure. The dielectric thickness results in a 2.5 times difference in capacitance in the post-passivation metal structure over the fine line metal structure. Then, the reduction in resistance times capacitance (RC product) is 6.25 times, or about 5 times.

In a second example, fine line metal thickness is about 1 µm, fine line metal width is about 10 µm, fine line IMD thickness is about 0.5 µm, and the line spacing is about 2 µm. Post-passivation metal thickness is about 5 µm, metal width is about 10 µm, dielectric thickness is about 5 µm, and lines spacing is about 10 µm. The metal thickness difference results in about a 5 times reduction in resistance in the post-passivation metal structure over the fine line metal structure. The capacitance is dominated in this case by plate capacitance with a reduction of 10 times difference in capacitance in the post-passivation metal structure over the fine line metal structure. Then, the reduction in RC product is about 50 times.

In a third example, typical capability fine line metal thickness is about 0.4 µm, fine line metal width is about 0.2 µm, fine line IMD thickness is about 0.4 µm, and the line spacing is about 0.2 µm. Post-passivation metal thickness is about 5 µm, metal width is about 10 µm, dielectric thickness is about 5 µm, and line spacing is about 10 µm. The metal thickness difference results in about a 625 times reduction in resistance in the post-passivation metal structure over the fine line metal structure. The capacitance is dominated by coupling capacitance and results in about a 4 times difference in capacitance in the post-passivation metal structure over the fine line metal structure. Then, the reduction in RC product is about 2,500 times.

In a fourth example, typical capability fine line metal thickness is about 0.4 µm, fine line metal width is about 0.2 µm, fine line IMD thickness is about 0.4 µm, and the line spacing is about 0.2 µm. Post-passivation metal thickness is about 10 µm, metal width is about 10 µm, dielectric thickness is about 10 µm, and line spacing is about 40 µm. The metal thickness difference results in about a 1250 times reduction in resistance in the post-passivation metal structure over the fine line metal structure. The capacitance is dominated by coupling capacitance and results in about an 8 times difference in capacitance in the post-passivation metal structure over the fine line metal structure. Then, the reduction in RC product is about 10,000 times.

Summarizing the above discussion, the RC product of the post-passivation metal structure can be about 5 to 10,000 times smaller than the RC product of the fine line metal structure.

It is difficult to achieve 100 times smaller RC product for the top layer metal of a fine line metallization system when compared to the bottom layer metal in the fine line metal interconnection process. For example, the metal line resistance at the top layer metal can be reduced by designing a wide piece of metal, while the capacitance of that metal line will be increasing accordingly (because the IMD is thin). Essentially, it is hard for fine line IC metals to achieve even 10 times smaller RC product for its top metal layer versus its bottom metal layer.

Sheet resistance is calculated by dividing the resistivity of the metal by the metal thickness. Sheet resistance is independent of metal line width (W) and length (L), and is in a unit of resistance per square. The number of square is counted by dividing length (L) by width (W), L/W. For example, resistivity of aluminum is 3.0 micro-ohm-cm, resistivity of copper is 2 micro-ohm-cm, and resistivity of gold is 2.2 micro-ohm-cm. In fine line metallization, for aluminum lines having a thickness of 0.8 µm, the sheet resistance is 38 milliohms per square. Damascene copper lines having a thickness of one micron have a sheet resistance of 20 milliohms per square. In contrast, the post-passivation metal lines of the present invention have a metal sheet resistance of less than 7 milliohms per square. If the post-passivation metal line is a 5.0 µm thick copper line, the sheet resistance is 4 milliohms per square. If the post-passivation metal line is a 4.0 µm thick gold line, the sheet resistance is 5.5 milliohms per square.

In summary, the sheet resistance of the post-passivation metal is at least two times smaller than the sheet resistance of the fine line metal. As shown in the examples above, the sheet resistance of the post-passivation metal can be five times smaller than the sheet resistance of the fine line metal. For some applications of post-passivation metal, a 10 µm thick copper thickness is used. In this case, the sheet resistance is 2 milliohms per square, which is at least 10 times smaller than that of the fine line metal.

In one embodiment of the invention, insulating polymer layer 5 may be omitted, with the thick metal layer formed directly on passivation layer 4 and connecting to the underlying metal pads.

Co-pending U.S. patent application Ser. No. 10/154,662, filed on May 24, 2002, herein incorporated by reference in its entirety, describes variations of the above-described process for forming the thick metal layers, including damascene processes. The RC product of the thick, wide, metal lines formed by these other methods is still significantly smaller than the RC product of the fine line metal lines, as detailed above.

Referring now back to FIG. 1*b*, the tops of the top metal conductor can now be used for connection of the IC to its environment, and for further integration into the surrounding electrical circuitry. Metal structures 10 and 26 are shown; these metals can be of any design in width and thickness to accommodate specific circuit design requirements. Metal structure 10 can, for instance, be used as a wirebonding pad, or a pad for a solder bump or a gold bump. Metal structure 26 can be used for power distribution or as a ground or signal bus.

Figure 2A:
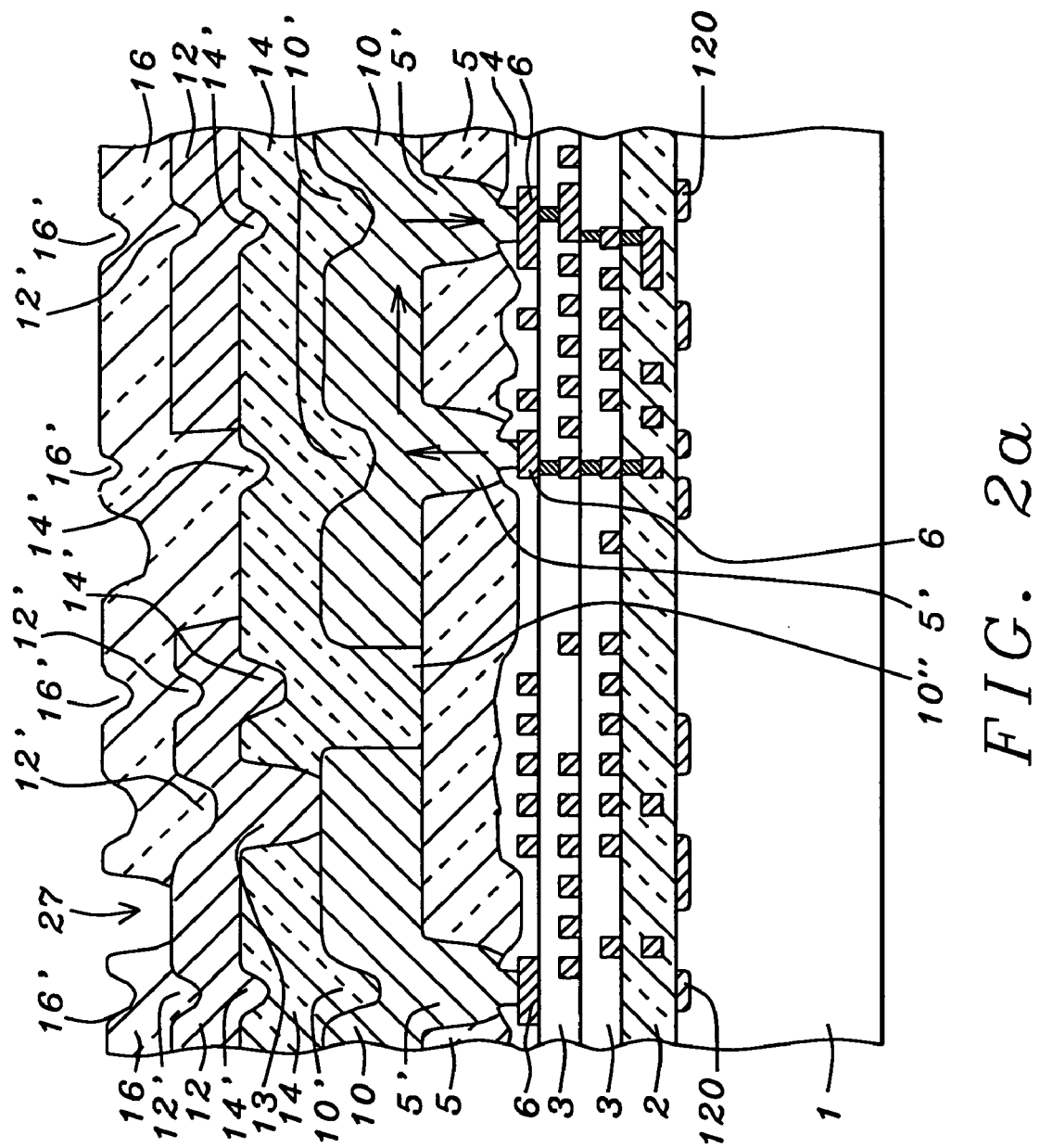
FIGS. 2a and 2b show cross sections of the present invention in a more complex circuit configuration.
Figure 2B:
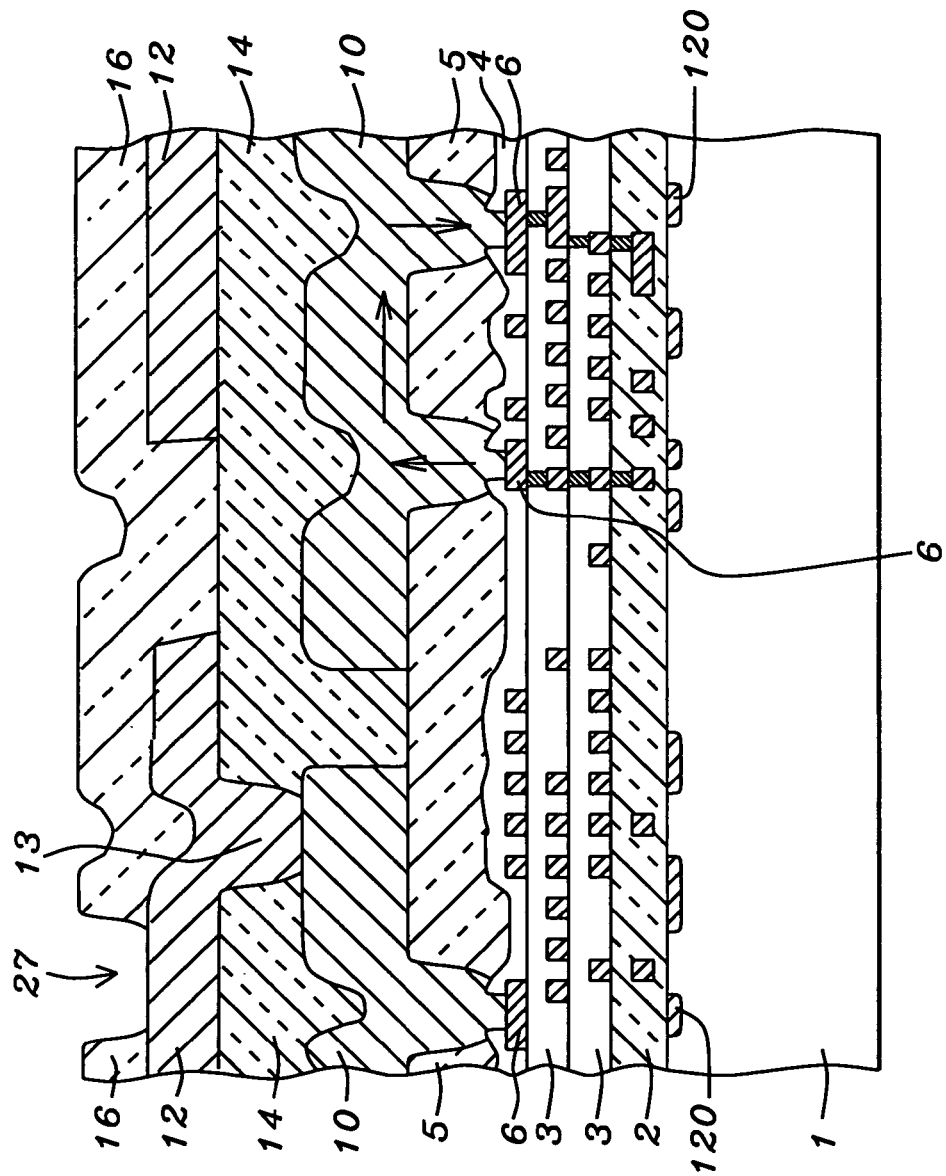

FIGS. 2*a* and 2*b* show how the present invention as indicated in FIG. 1*b* can be further extended to include multiple layers of metal. The lower level build up of this cross section is identical to the build up shown in FIG. 1*b* with a silicon wafer 1, the device layer 2 comprising poly silicon, the metal and dielectric combined layer 3, the passivation layer 4, the insulating polymer layer 5 and the first metal 10, formed by selective deposition on top of layer 5. The function of the structure that has been described in FIG. 1*b* can be further extended by depositing another layer of intermetal polymer 14 on top of the previously deposited insulating polymer layer 5 and overlying the first metal 10. Selective deposition is used for second metal 12. This second metal 12 can be connected with first metal 10 through opening 13. Depositing second metal 12 on top of layer 14 can thus further extend this process. Additional alternating layers of intermetal polymer and metal lines and/or power or ground planes may be added above layers 12 and 14, as needed. A top polymer layer 16 may be formed as shown. Opening 27 may be made in the top polymer layer 16 for connection to external circuits or for testing. Connections may be made to external circuits through solder bumps, gold bumps, or wirebonds.

Since polymer, for example polyimide, cannot perfectly planarize underlying steps, gaps, or dips, there are concerns in the subsequent processes. In the post-passivation process, the thick metal creates big steps and gaps, and the thick polymer dielectric in addition generates deep openings. In FIG. 2a, openings 5' in the polymer insulating layer 5 results in dips 10' at the surface of the first post-passivation metal layer 10. In addition to the dips 10', there is a metal gap 10" between two pieces of the first metal 10. The dips 10' and gap 10" further result in dips 14' at the surface of the first intermetal polymer layer 14, dips 12' at the surface of the second metal layer 12, and dips 16' at the surface of the top polymer layer 16. In FIG. 2b, the first intermetal polymer layer 14 is planarized by chemical-mechanical polishing (CMP). Dips 14' at the surface of the first intermetal polymer layer 14, dips 12' at the surface of the second metal layer 12, and dips 16' at the surface of the top polymer layer 16, all shown in FIG. 2a, do not appear in FIG. 2b using the CMP process.

The insulating polymer layer 5 and intermetal polymer layer 14 that are formed between the thick, post-passivation metal lines are formed to a thickness of between about 2 and 30 microns, after curing, and are thicker than the intermetal dielectric layers formed in the typical fine-line metal scheme (layers 3) by a ratio of between about 2 and 500. The thicker, organic polymer 5 and 14 used in the post-passivation process of the invention reduces capacitance between the thick metal lines 10 and 12. The inorganic materials, such as silicon oxide, used in the fine-line metallization system 3, cannot be formed to such thicknesses due to a tendency to crack at these thicknesses. This reduced capacitance reduces the RC product of the post passivation metal system of the invention, as described above.

FIG. 1b shows a basic design advantage of the invention. This advantage allows for the sub-micron or fine-lines, that run in the immediate vicinity of the metal layers 3 and the contact points 6, to be extended in an upward direction 20 through metal interconnect 71 formed in the openings 7 of the insulating polymer layer 5 and in the openings 7' of the passivation layer 4. This extension continues in the direction 22 in the horizontal plane of the thick, wide metal interconnect 26 and comes back down in the downward direction 24 through metal interconnect 72 formed in the openings 7 of the insulating polymer layer 5 and in the openings 7' of the passivation layer 4. The functions and constructs of the passivation layer 4 and the insulating polymer layer 5 remain as previously highlighted. This basic design advantage of the invention is to "elevate" or "fan-up" the fine-line interconnects and to remove these interconnects from the micron and sub-micron level to a post-passivation metal interconnect level 10 and 26 that has considerably larger dimensions and is therefore characterized by smaller resistance and capacitance and is easier and more cost effective to manufacture. It therefore further adds to the importance of the invention in that it makes micron and sub-micron wiring accessible at a wide-metal level. The interconnections 26, 71 and 72 interconnect the fine-level metal by going up through the passivation and polymer or polyimide dielectric layers 4 and 5, traversing over a distance on the thick, wide-metal level 26 and continuing by descending from the thick, wide-metal level 26 back down to the fine-metal level by again traversing down through the passivation and polymer or polyimide dielectric layers 4 and 5. The extensions that are in this manner accomplished need not be limited to extending fine-metal interconnect points 6 of any particular type, such as signal or power or ground, with thick, wide metal line 26.

Figure 4A:
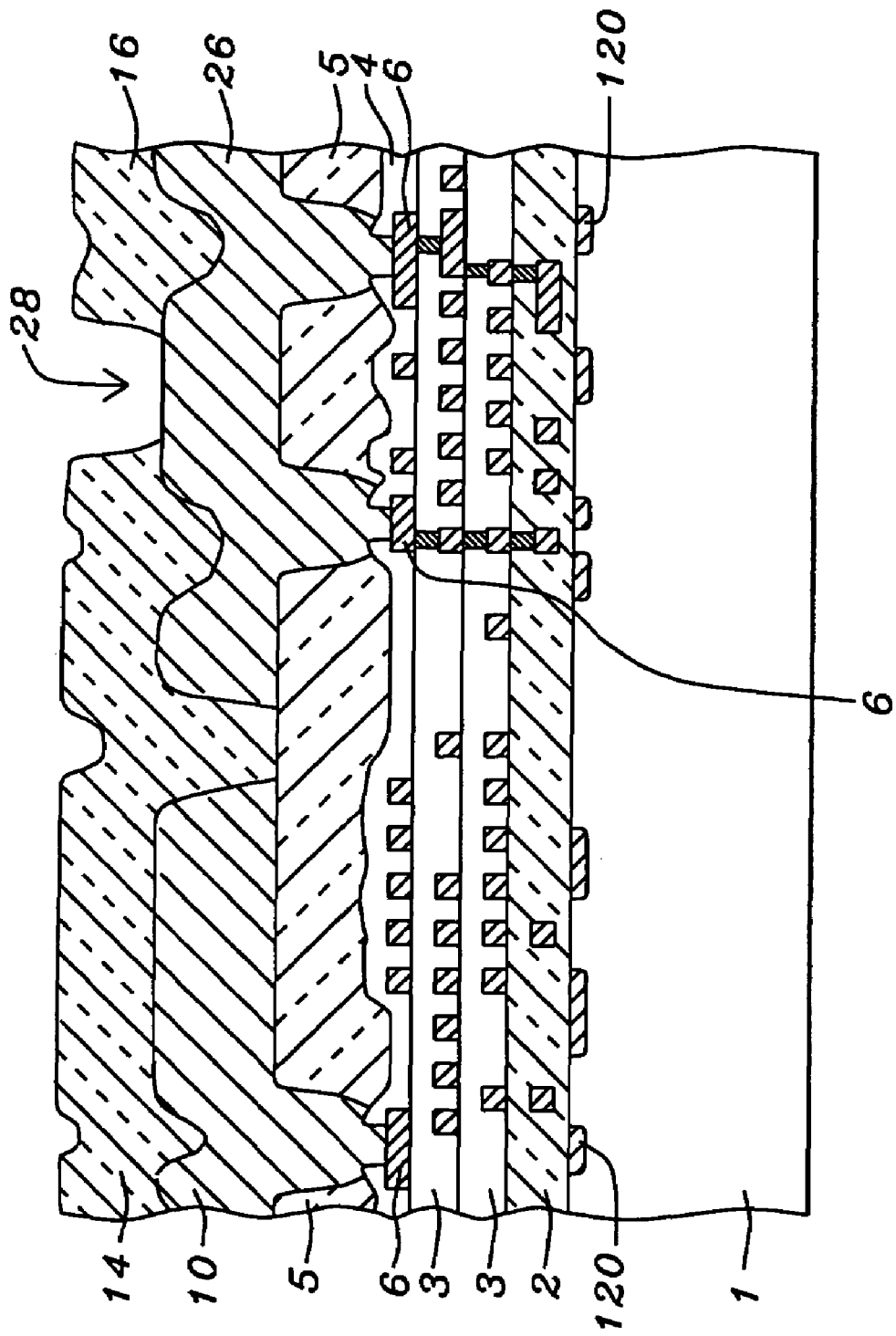
FIGS. 4a and 4b show an extension of the IC interconnect scheme by adding power, ground and signal distribution capabilities.
Figure 4B:
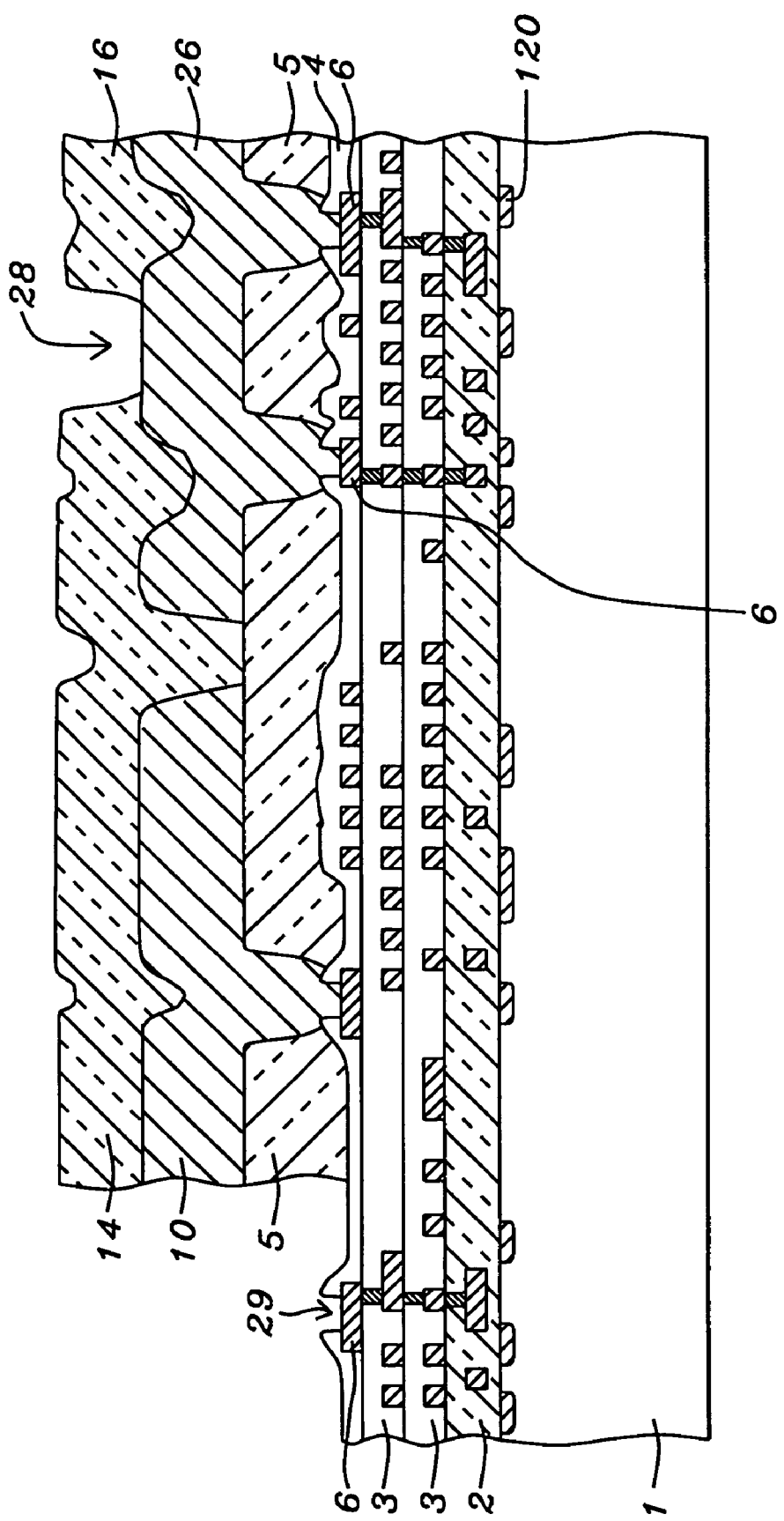

FIGS. 4a and 4b show how the interconnect aspect of the invention (as shown by arrows 20/22/24 of FIG. 1b) can further be extended to add external power, ground and signal distribution. This allows two portions of an internal circuit to be connected externally using a single pin-in or pin-out. Top polymer layer 16 has an opening 28 for the external connection. Connections to the next level of packaging may be made through solder bumps, gold bumps, or wirebonds. There is the possibility of many contact points to the next level package. In this case, the next level package, for example, a BGA substrate, requires fine pitch metals to accommodate these many contact points. By being able to readily extend the post-passivation metal dimensions it also becomes possible to interconnect power, ground and signal lines at a post-passivation metal level thereby reducing the cost and complexity of performing this function in a BGA substrate. FIG. 4b further shows opening 29 in the passivation layer 4 made to a top layer 6 of the fine-line interconnection metallization structure. Opening 28 is made to an upper contact point 26 in the thick, wide metallization structure while opening 29 is made to a lower contact point 6 in the fine-line interconnection metallization structure. Connections to the next level of packaging may be made to the lower contact point through opening 29 through solder bumps, gold bumps, or wirebonds.

FIGS. 5 through 8 show further detail to demonstrate the concepts of fan-out, pad relocation, the creation of common ground, power and signal pads, and the creation of additional pads.

Figure 5A:
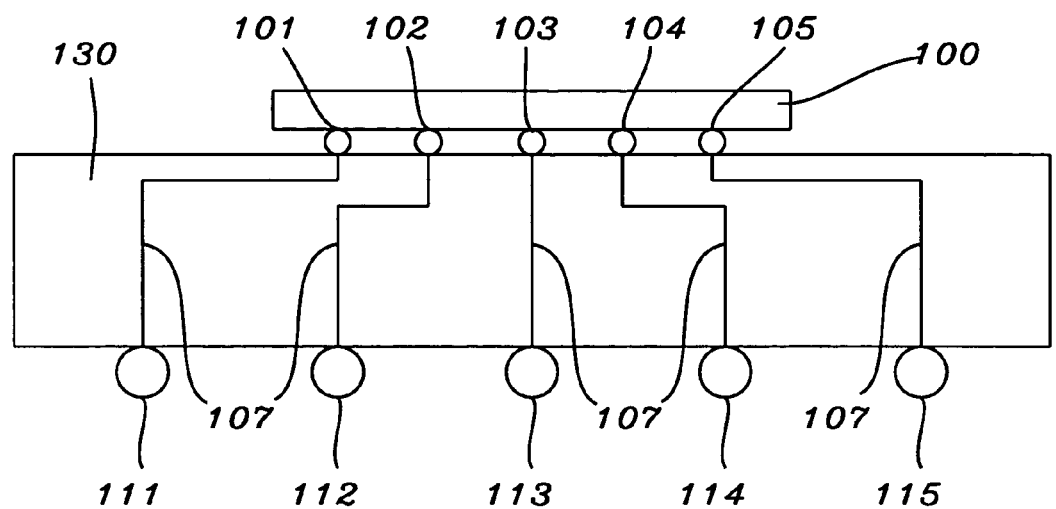
FIG. 5a shows detail regarding a fan-out function in a flip-chip BGA device.

FIG. 5a shows the concept of fan-out for a flip-chip on a BGA substrate. A cross section of an integrated circuit 100 is shown with five solder bumps 101 through 105. By using a BGA substrate 130 and the wiring 107 within the substrate 130, bump 101 can be repositioned to location 111, bump 102 to location 112, etc. for the remaining solder bumps 103 through 105. The separation of contact points 111 through 115 is considerably larger than the separation of the original solder bumps 101 through 105. The BGA substrate 130 allows for spreading the distance between the contact points or bumps 111-115 of the BGA device.

Figure 6A:
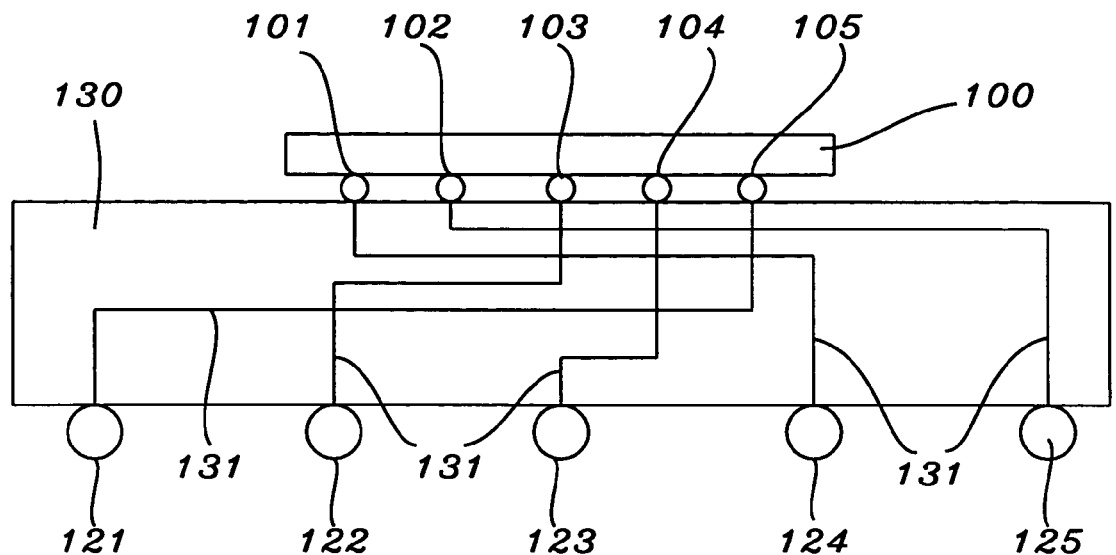
FIG. 6a shows detail regarding a pad relocation function in a flip-chip BGA device.

FIG. 6a shows the concept of pad relocation for a flip chip on a BGA substrate. Contact bumps 101 through 105 are shown. By using BGA substrate 130 and the wiring 131 that is provided within the substrate, the BGA pads can be arranged in a different and arbitrary sequence that is required for further circuit design or packaging. For instance contact bump 101, which is on the far left side of the IC 100, is re-routed to location 124 which is on the second far right of the BGA substrate 130. The re-arrangements of the other BGA solder bumps can readily be learned from following the wiring 131 within the substrate 130 and by tracing from solder bump 101-105 to one of the contact points 121 through 125 of the BGA substrate 130.

Figure 7A:
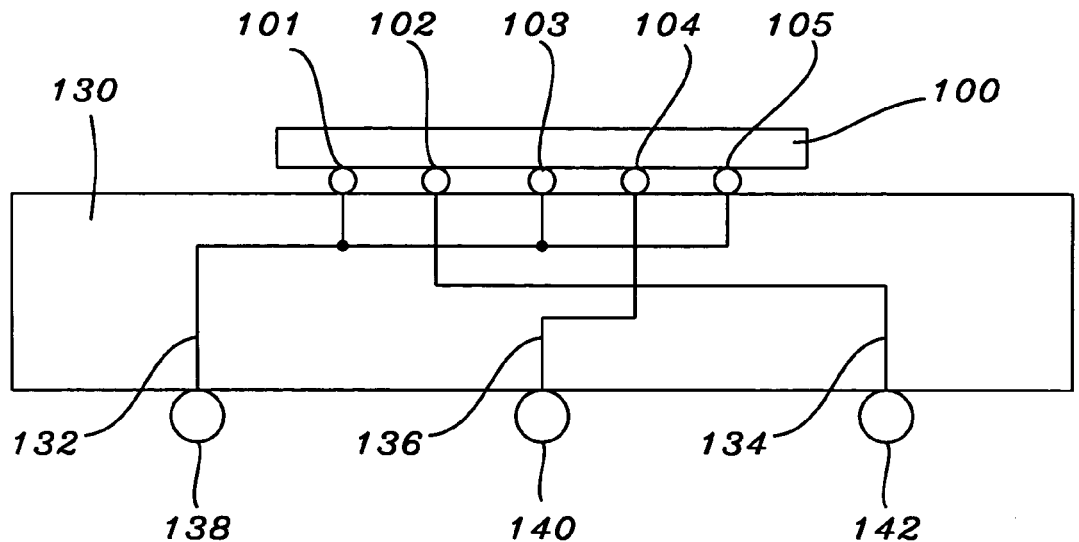
FIG. 7a shows detail regarding the usage of common power, ground and signal pads in a flip-chip BGA device.

FIG. 7a shows pad reduction, the interconnecting of solder bumps into common power, ground or signal pads on a flip-chip BGA substrate. The IC 100 is again shown with five solder bumps 101 through 105. The BGA substrate 130 contains a wiring scheme 132, 134 and 136 that contains in this example three wiring units, one for each for the power, ground and signal bumps of the IC. Wire arrangement 132 connects solder bumps 101, 103 and 105 to interconnect point 138 of the BGA substrate 130. It can further be seen that solder bump 104 is connected to interconnect point 140 of the BGA substrate 130 by means of the wire arrangement 136, while solder bump 102 is connected to interconnect point 142 of the BGA substrate 130 by means of the wire arrangement 134. The number of pins required to interconnect the IC 100 is in this manner reduced from five to three. For more solder bumps, as is the case for a typical flip-chip IC, the numeric effect of the indicated wiring arrangement is considerably more beneficial.

Figure 8A:
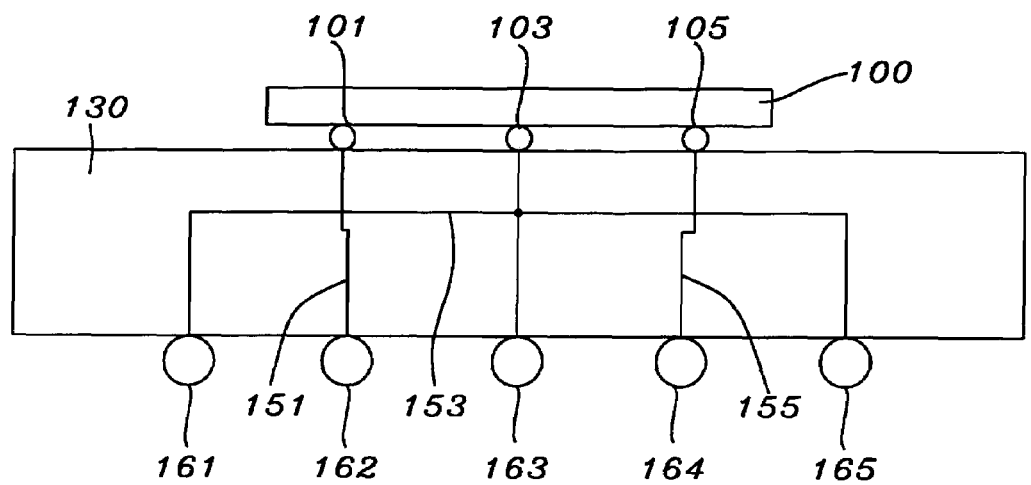
FIG. 8a shows detail regarding pad addition in a flip-chip BGA device. One contact pad on the chip is connected to several contact points on the BGA substrate.

FIG. 8a shows pad addition, the interconnecting of single solder bumps into several contact points on a flip-chip BGA substrate. The IC 100 is shown with three solder bumps 101, 103, 105. The BGA substrate 130 contains a wiring scheme 151, 153 and 155 that contains in this example three wiring units. Wire arrangement 153 connects solder bump 103 to three interconnect points 161, 163 and 165 of the BGA substrate 130. It can further be seen that solder bump 101 is connected to interconnect point 162 of the BGA substrate 130 by means of the wire arrangement 151, while solder bump 105 is connected to interconnect point 164 of the BGA substrate 130 by means of the wire arrangement 155. The number of pins required to interconnect the IC 100 is in this manner increased from three to five. The added two contact points 161, 165 on the BGA substrate are useful for connecting to the next level package.

The concept of fan-out, pad relocation, pad reduction, and pad addition can be realized using the post-passivation metal interconnection scheme described in this invention, to replace the function of BGA substrate 130. From FIGS. 5b, 6b, 7b, and 8b, it can be seen that the extended functionality and extended wiring ability that are provided by the interconnect wiring schemes that are typically created in the BGA substrate 130 can be created using the method of the invention, on device 100. Some of the methods and possibilities of interconnect line routing that can be implemented using the method of the invention are highlighted in the following paragraphs.

Figure 5B:
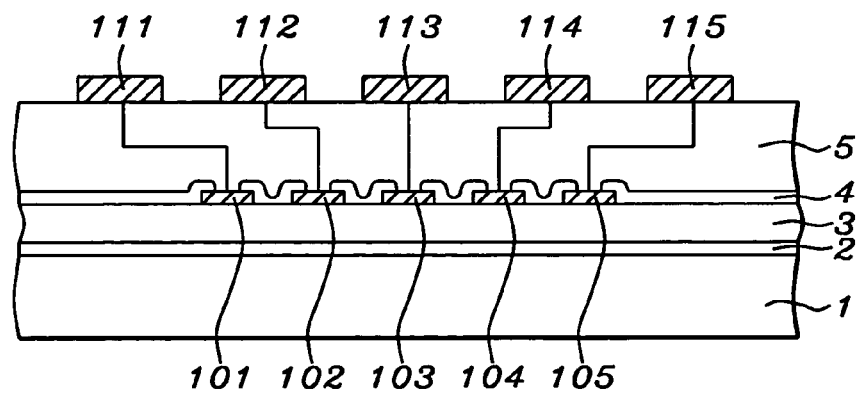

Fan-out capability can be provided by the invention, using the metal conductors within the openings through the passivation layer that connect electrical contact pads of the top metallization structure with contact points of the interconnecting metallization structure. FIG. 5b shows a schematic view of the connections between the post-passivation metal pads 111–115 and the fine line metal pads 101–105 using fan-out. Each of the electrical contact points 101–105 of the interconnecting metallization structure is connected directly and sequentially with at least one electrical contact point 111–115 of the post-passivation metallization structure. In a fan-out scheme, the distance between electrical contact points 111–115 of the post-passivation metallization structure is larger than the distance between electrical contact points 101–105 of the fine line interconnecting metallization structure.

Figure 6B:
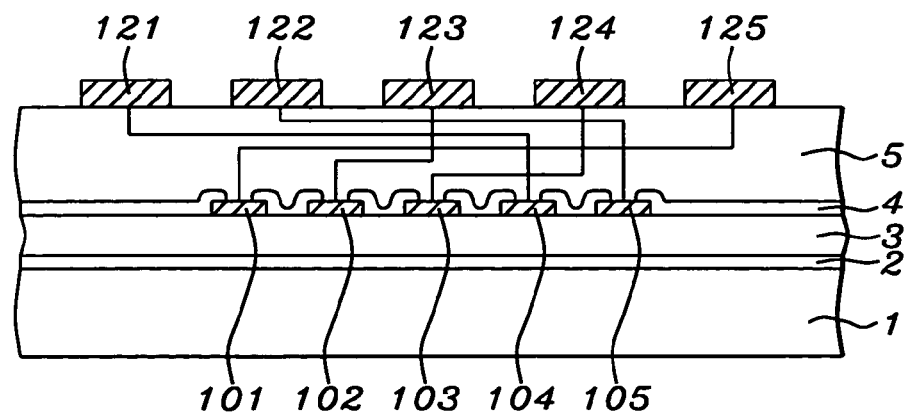

Pad relocation may also be accomplished by the method of the invention. FIG. 6b is a schematic view of connections between post-passivation metal pads 121–125 and fine line metal pads 101–105, showing pad relocation. Electrical contact points 121–125 of the post-passivation metallization structure are connected with the contact points 101–105 of the fine line interconnecting metallization structure, directly but not necessarily sequentially, thereby creating a pad relocation effect.

Figure 7B:
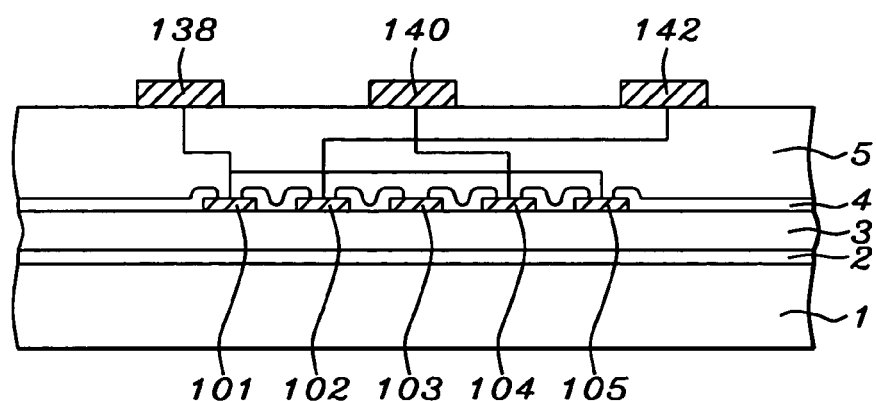

A reduction effect may also be accomplished by the method of the invention, wherein common nodes are connected together. FIG. 7b shows a schematic view of connections between post-passivation metal pads 138, 140, and 142 and fine line metal pads 101–105. Electrical contact points 138, 140, and 142 of the post-passivation metallization structure are connected with contact points 101–105 of the fine line interconnecting metallization structure, where fewer contact points 138, 140, and 142 are used in the post-passivation metallization structure, since functionally equivalent contact points 101–105 in the fine line interconnecting metallization structure are connected together. That is, the number of contact points for a particular electrical function among the electrical contact points 138, 140, and 142 of the post-passivation metallization structure is smaller than the number of electrical contact points 101–105 of the fine line interconnecting metallization structure.

Figure 8B:
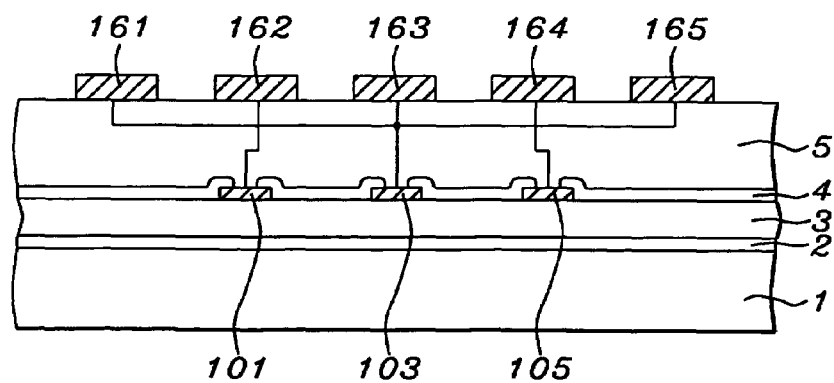
FIG. 8b shows a schematic view of pad addition connections between top pads of post-passivation metal scheme and lower pads of fine line metal scheme using the post-passivation interconnection to replace the pad addition function of the BGA substrate interconnection as in the example of FIG. 8a. One contact point on the fine line metal scheme is connected to several contact points of the post-passivation scheme.

An addition effect may also be accomplished by the method of the invention, wherein a single node is connected to several contact points at different locations. FIG. 8b shows a schematic view of connections between post-passivation metal pads 161–165 and fine line metal pads 101, 103 and 105. Electrical contact points 161–165 of the post-passivation metallization structure are connected with contact points 101, 103 and 105 of the fine line interconnecting metallization structure, where more contact points 161–165 are used in the post-passivation metallization structure, since a single point 103 in the fine line interconnecting metallization structure is connected to several contacts 161, 163 and 165 on the post-passivation metal structure with equivalent electrical functionality. That is, the number of contact points for a particular electrical function among the electrical contact points 161, 163 and 165 of the post-passivation metallization structure is greater than the number of electrical contact points 101, 103 and 105 of the fine line interconnecting metallization structure.

Some of the advantages of the present invention are:
1) improved speed of the IC interconnections due to the use of thick, wide metal lines (which results in lower resistance) and thicker dielectrics between the interconnecting lines (which results in lower capacitance and reduced RC delay). The improved speed of the IC interconnections results in improved performance of High Performance IC's.
2) an inexpensive manufacturing process since there is no need for expensive equipment that is typically used in sub-micron IC fabrication; there is also no need for the extreme clean room facilities (class 10 or less) that are typically required for sub-micron manufacturing. Class 100 or more clean rooms can be used for the post-passivation process of the invention.
3) power/ground buses and clock distribution networks are easier to integrate within the design of IC's.
4) system-on-chip designs will benefit from the present invention since it allows ready and cost effective interconnection between functional circuits that are positioned at relatively large distances from each other on the chip.
5) form the basis for a computer based routing tool that automatically routes interconnections that exceed a predetermined length in accordance with the type of interconnection that needs to be established.
6) provide a means to standardize BGA packaging. That is, a customization usually achieved by wiring in the BGA substrate can be moved to the post-passivation metallization structure of the invention.
7) be applicable to solder bumps, gold bumps, and wirebonding for making further circuit interconnects.
8) provide a means for fan-out, relocation, and pad number reduction and addition using solder bump, wirebond, and gold bump.
9) provide a means for pad fan-out, relocation, reduction and addition thereby providing increased flexibility. By fan-out, relocation, reduction and addition of the pads, flexibility for fitting into varieties of next level packaging by wirebonding, solder bumps or gold bumps is achieved. This flexibility in pad location, pad number and pad arrangement is very useful in system-in-package and multi-chip module approaches.
10) provide a means for common power, ground and signal lines thereby reducing the number of pins required to interconnect with surrounding circuits.

11) provide a means for fan-up function by the application of small passivation (0.1 um or more) vias.
12) provide the means for extending a fine-wire interconnect scheme to a wide-wire interconnect scheme.
13) replace BGA interconnections by providing finer-than-BGA-substrate metal design rules on the post-passivation metal scheme. The BGA design can therefore be simplified, and the cost is greatly reduced.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. A method for forming a wirebond and a post-passivation metallization system for an integrated circuit, comprising:
   providing a silicon substrate, a MOS device in and on said silicon substrate, a first metallization structure over said silicon substrate, wherein said first metallization structure comprises a first metal layer and a second metal layer over said first metal layer, a dielectric layer between said first and second metal layers, and a passivation layer over said first metallization structure and over said dielectric layer;
   forming a first polymer layer on said passivation layer, wherein said forming said first polymer layer comprises depositing a photosensitive polymer on said passivation layer;
   forming a second metallization structure over said first polymer layer, wherein said second metallization structure comprises a metal line having a sheet resistance smaller than 7 milliohms per square, and wherein said forming said second metallization structure comprises forming a first adhesion/barrier layer over said first polymer layer, forming a first gold layer on said first adhesion/barrier layer, performing a photolithography process to form a photoresist layer on said first gold layer, an opening in said photoresist layer exposing said first gold layer, wherein said photoresist layer has a thickness between 2 and 100 micrometers and wherein said performing said photolithography process comprises using a 1X stepper or aligner, electroplating a second gold layer having a thickness between 2 and 100 micrometers on said first gold layer exposed by said opening in said photoresist layer, removing said photoresist layer, removing said first gold layer not under said second gold layer, and removing said first adhesion/barrier layer not under said second gold layer; and
   wirebonding to a contact point of said second metallization structure, wherein said contact point is directly over said polymer layer and directly over said MOS device.

2. The method of claim 1, wherein said first metallization structure comprises a damascene copper and a second adhesion/barrier layer under said damascene copper and at a sidewall of said damascene copper.

3. The method of claim 1, wherein said passivation layer comprises a nitride layer having a thickness greater than 0.3 micrometers.

4. The method of claim 1, wherein said passivation layer comprises an oxide layer and a nitride layer over said oxide layer.

5. The method of claim 1, wherein said second metallization structure connects multiple separate portions of said first metallization structure.

6. The method of claim 1, wherein said forming said first adhesion/barrier layer comprises sputtering a titanium-tungsten-alloy layer with a thickness between 0.01 and 3 micrometers over said first polymer layer.

7. The method of claim 1, further comprising forming a polymer layer over said second metallization structure.

8. The method of claim 1, wherein said forming said first gold layer comprises sputtering said first gold layer with a thickness between 0.05 and 3 micrometers on said first adhesion/barrier layer.

9. The method of claim 1, wherein said forming said first gold layer comprises a sputtering process.

10. The method of claim 1, wherein said forming said first adhesion/barrier layer comprises a sputtering process.

11. The method of claim 1, wherein said forming said first adhesion/barrier layer comprises forming a titanium-containing layer over said first polymer layer.

12. The method of claim 1, wherein said forming said first adhesion/barrier layer comprises sputtering a titanium layer with a thickness between 0.01 and 3 micrometers over said first polymer layer.

13. A method for forming a post-passivation metallization system for an integrated circuit chip, comprising:
    providing a silicon substrate, multiple MOS devices in and on said silicon substrate, a first metallization structure over said silicon substrate, wherein said first metallization structure is formed by a process comprising using a 5X stepper or scanner, and wherein said first metallization structure comprises a damascene copper and a first adhesion/barrier layer under said damascene copper and at a sidewall of said damascene copper, and a passivation layer over said first metallization structure, wherein said passivation layer comprises a topmost oxynitride layer of said integrated circuit chip;
    forming a first polymer layer on said passivation layer, wherein said forming said polymer layer comprises depositing a photosensitive polymer on said passivation layer; and
    forming a second metallization structure over said first polymer layer, wherein said second metallization structure connects said multiple MOS devices through separate portions of said first metallization structure, and wherein said second metallization structure comprises a metal line having a sheet resistance smaller than 7 milliohms per square, wherein said forming said second metallization structure comprises forming a second adhesion/barrier layer over said first polymer layer, forming a seed layer on said second adhesion/barrier layer, performing a photolithography process to form a photoresist layer on said seed layer, an opening in said photoresist layer exposing said seed layer, wherein said performing said photolithography process comprises using a 1X stepper, electroplating a bulk metal layer on said seed layer exposed by said opening in said photoresist layer, wherein the material of said bulk metal layer is the same as that of said seed layer, removing said photoresist layer, removing said seed layer not under said bulk metal layer, and removing said adhesion/barrier layer not under said bulk metal layer.

14. The method of claim 13, wherein said passivation layer comprises a nitride layer having a thickness greater than 0.3 micrometers.

15. The method of claim 13, wherein said passivation layer comprises an oxide layer and a nitride layer over said oxide layer.

16. The method of claim 13, further comprising forming a second polymer layer over said second metallization structure.

17. The method of claim 13, wherein said forming said second adhesion/barrier layer comprises sputtering a titanium-tungsten-alloy layer over said first polymer layer.

18. The method of claim 13, wherein said forming said second adhesion/barrier layer comprises sputtering a titanium layer over said first polymer layer.

19. The method of claim 13, wherein said forming said seed layer comprises a sputtering process.

20. The method of claim 13, wherein said electroplating said bulk metal layer comprises electroplating a gold layer with a thickness between 2 and 100 micrometers on said seed layer exposed by said opening in said photoresist layer.

21. The method of claim 13, wherein said forming said adhesion/barrier layer comprises a sputtering process.

22. The method of claim 13, wherein said electroplating said bulk metal layer comprises electroplating a copper layer with a thickness between 2 and 100 micrometers on said seed layer exposed by said opening in said photoresist layer.

23. The method of claim 13, wherein said second metallization structure comprises a wirebonding pad.

24. The method of claim 13, further comprising forming a solder bump connected to said second metallization structure.

25. The method of claim 13, wherein an undercut with an edge of said second adhesion/barrier layer recessed from an edge of said bulk metal layer is between 0.03 and 2 micrometers.

26. The method of claim 20, wherein said electroplating said bulk metal layer comprises electroplating a palladium layer on said seed layer exposed by said opening in said photoresist layer.

27. A circuit component comprising:
an integrated circuit chip comprising a silicon substrate, a MOS device in and on said silicon substrate, a first metallization structure over said silicon substrate, wherein said first metallization structure comprises a first metal layer and a second metal layer over said first metal layer, a dielectric layer between said first and second metal layers, a passivation layer over said first metallization structure and over said dielectric layer, a second metallization structure over said passivation layer, wherein said second metallization structure comprises a metal line having a sheet resistance smaller than 7 milliohms per square and having a width greater than 2 micrometers, and wherein said second metallization structure comprises a first adhesion/barrier layer over said passivation layer, a first gold layer on said first adhesion/barrier layer, and a second gold layer on said first gold layer, wherein said first adhesion/barrier layer has a thickness between 0.01 and 3 micrometers, said first gold layer has a thickness between 0.05 and 3 micrometers, and said second gold layer has a thickness between 2 and 100 micrometers, and a first polymer layer over said second metallization structure; and
a wirebond connecting a contact point of said second metallization structure to an external circuit, wherein said contact point is directly over said MOS device.

28. The circuit component of claim 27, further comprising a second polymer layer between said second metallization structure and said passivation layer.

29. The circuit component of claim 27, wherein said first adhesion/barrier layer comprises a titanium layer over said passivation layer.

30. The circuit component of claim 27, wherein said first metallization structure comprises a damascene copper and a second adhesion/barrier layer under said damascene copper and at a sidewall of said damascene copper.

31. The circuit component of claim 27, wherein said passivation layer comprises a nitride layer having a thickness greater than 0.3 micrometers.

32. The circuit component of claim 27, wherein said passivation layer comprises an oxide layer and a nitride layer over said oxide layer.

33. The circuit component of claim 28, wherein said second polymer layer comprises polyimide.

34. The circuit component of claim 28, wherein said second polymer layer has a thickness between 2 and 100 micrometers.

35. The circuit component of claim 27, wherein said first adhesion/barrier layer comprises a titanium-tungsten-alloy layer over said passivation layer.

36. The circuit component of claim 27, wherein an undercut with an edge of said first adhesion/barrier layer recessed from an edge of said first gold layer is between 0.03 and 2 micrometers.

37. An integrated circuit chip comprising:
a silicon substrate;
multiple MOS devices in and on said silicon substrate;
a first metallization structure over said silicon substrate, wherein said first metallization structure comprises a first metal layer and a second metal layer over said first metal layer;
a passivation layer over said first metallization structure and over said dielectric layer, wherein said passivation layer comprises a topmost nitride layer of said integrated circuit chip;
a first polymer layer over said passivation layer;
a second metallization structure over said first polymer layer, wherein said second metallization structure connects multiple MOS devices through separate portions of said first metallization structure, wherein said second metallization structure comprises a third metal layer and fourth metal layer over said third metal layer, wherein one of said third and fourth metal layers comprises a first adhesion/barrier layer over said first polymer layer, a seed layer on said first adhesion/barrier layer, and an electroplated metal layer on said seed layer, and wherein said second metallization structure comprises a metal line having a sheet resistance smaller than 7 milliohms per square; and
a second polymer layer between said third and fourth metal layers.

38. The circuit component of claim 37, wherein said first polymer layer has a thickness between 2 and 100 micrometers.

39. The circuit component of claim 37, wherein said first polymer layer comprises polyimide.

40. The circuit component of claim 37, wherein said first polymer layer comprises benzocyclobutene.

41. The circuit component of claim 37, wherein said passivation layer comprises a nitride layer having a thickness greater than 0.3 micrometers.

42. The integrated circuit chip of claim 37, wherein said passivation layer comprises an oxide layer and a nitride layer over said oxide layer.

43. The integrated circuit chip of claim 37, wherein said electroplated metal layer comprises a gold layer with a thickness between 2 and 100 micrometers.

44. The integrated circuit chip of claim 37, wherein said electroplated metal layer comprises a copper layer with a thickness between 2 and 100 micrometers.

45. The integrated circuit chip of claim 37, wherein said electroplated metal layer comprises a palladium layer.

46. The integrated circuit chip of claim 37, wherein said first adhesion/barrier layer comprises titanium.

47. The integrated circuit chip of claim 37, wherein said first metallization structure comprises a damascene copper and a second adhesion/barrier layer under said damascene copper and at a sidewall of said damascene copper.

48. The integrated circuit chip of claim 37, wherein said one of said third and fourth metal layers further comprises a nickel layer on said electroplated metal layer.

* * * * *